(12) United States Patent
Kitagawa et al.

(10) Patent No.: US 11,626,299 B2
(45) Date of Patent: Apr. 11, 2023

(54) COVER FOR SWING MEMBER OF SUBSTRATE PROCESSING APPARATUS, SWING MEMBER OF SUBSTRATE PROCESSING APPARATUS, AND SUBSTRATE PROCESSING APPARATUS

(71) Applicant: EBARA CORPORATION, Tokyo (JP)

(72) Inventors: Yoshitaka Kitagawa, Tokyo (JP);
Hisajiro Nakano, Tokyo (JP);
Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 144 days.

(21) Appl. No.: 16/907,679

(22) Filed: Jun. 22, 2020

(65) Prior Publication Data

US 2020/0402820 A1 Dec. 24, 2020

(30) Foreign Application Priority Data

Jun. 24, 2019 (JP) .............................. JP2019-116348

(51) Int. Cl.
*B08B 3/04* (2006.01)
*H01L 21/67* (2006.01)

(52) U.S. Cl.
CPC .......... *H01L 21/67051* (2013.01); *B08B 3/04* (2013.01); *H01L 21/67046* (2013.01); *H01L 21/67219* (2013.01)

(58) Field of Classification Search
CPC ......... H01L 21/67051; H01L 21/67046; H01L 21/67219; B08B 3/04
USPC ........................................................ 134/180
See application file for complete search history.

(56) References Cited

U.S. PATENT DOCUMENTS

| | | | |
|---|---|---|---|
| 6,500,055 B1 * | 12/2002 | Adams .................. | B24B 37/042 451/291 |
| 2016/0176016 A1 * | 6/2016 | Attur ..................... | B24B 53/017 451/446 |
| 2019/0088510 A1 | 3/2019 | Ishibashi | |

FOREIGN PATENT DOCUMENTS

| | | |
|---|---|---|
| JP | 2012-182371 A | 9/2012 |
| WO | 2017/154673 A1 | 9/2017 |

* cited by examiner

*Primary Examiner* — Tinsae B Ayalew
(74) *Attorney, Agent, or Firm* — Pearne & Gordon LLP

(57) ABSTRACT

A cover for a swing member of a substrate processing apparatus includes an upper surface including a first groove, and a first side edge and a second side edge located respectively at both ends of the upper surface in the short-length direction of the cover, where a bottom portion of the first groove is located lower than the first side edge and the second side edge.

13 Claims, 9 Drawing Sheets

COVER FOR SWING MEMBER OF SUBSTRATE PROCESSING APPARATUS, SWING MEMBER OF SUBSTRATE PROCESSING APPARATUS, AND SUBSTRATE PROCESSING APPARATUS

BACKGROUND OF THE INVENTION

Field of the Invention

The present invention relates to a cover for a swing member of a substrate processing apparatus, a swing member for a substrate processing apparatus, and a substrate processing apparatus.

The present application claims priority based on Japanese Patent Application No. 2019-116348 filed in Japan on Jun. 24, 2019, and the content thereof is incorporated herein.

Description of the Related Art

Conventionally, a substrate processing apparatus described in Japanese Unexamined Patent Application, First Publication No. 2012-182371 has been known. In this substrate processing apparatus, processing using a processing liquid is performed. A nozzle supplying the processing liquid is held at the tip portion of a horizontally extending nozzle arm. The nozzle arm is coupled to the nozzle swing mechanism. The nozzle swing mechanism rotates the nozzle and the nozzle arm around a vertical axis of rotation.

SUMMARY OF THE INVENTION

In the nozzle arm, a pool of the processing liquid may be formed on the upper surface of the nozzle arm. When the nozzle arm swings, there is a concern that the liquid pool may spill from the upper surface due to inertia and be attached to the substrate. For this reason, in Japanese Unexamined Patent Application, First Publication No. 2012-182371, the upper surface of the nozzle arm is tilted in a short-length direction to improve liquid drainage. However, the possibility that the processing liquid spilled from the upper surface may be attached to the substrate has not been considered.

The present invention has been made in view of the above circumstances, and the present invention is to prevent the processing liquid attached to an upper surface of a swing member of a substrate processing apparatus from spilling on a processing target such as a substrate.

In a cover for a swing member of a substrate processing apparatus according to an aspect of the present invention, the cover includes an upper surface including a first groove, and a first side edge and a second side edge located respectively at both ends of the upper surface in the short-length direction of the cover, where a bottom portion of the first groove is located lower than the first side edge and the second side edge.

In the cover for a swing member of the above-described substrate processing apparatus, the first groove may be formed by a pair of inclined inner surfaces that are inclined so as to become lower as approaching each other in the short-length direction.

In the cover for a swing member of the above-described substrate processing apparatus, the pair of inclined inner surfaces may be continuous to the first side edge and the second side edge.

In addition, in the cover for a swing member of the above-described substrate processing apparatus, the upper surface of the cover may incline downward entirely over the cover from a tip end portion to a base end portion in a longitudinal direction of the cover.

In a cover for a swing member of a substrate processing apparatus according to an aspect of the present invention, the cover includes an upper surface that is inclined downward entirely over the cover from a tip end portion to a base end portion in the longitudinal direction of the cover.

In the cover for a swing member of the above-described substrate processing apparatus, the cover may be formed by a plurality of inclined surfaces that are continuous in the longitudinal direction.

In the cover for a swing member of the above-described substrate processing apparatus, a second groove extending vertically downward may be formed in the base end portion of the cover.

In a swing member of a substrate processing apparatus according to an aspect of the present invention, the swing member includes an arm body, and the cover described above attached to the arm body.

In the swing member of the above-described substrate processing apparatus, the arm body may include a lower surface exposed from the cover, and at least a portion of a lower surface of the arm body may be lowered from one side edge toward the other side edge of the arm body in a short-length direction.

In the swing member of the above-described substrate processing apparatus, the arm body may be movable between a processing position located above a processing region where the processing liquid is used and a retracted position retracted from above the processing region, and the other side edge of a lower surface of the arm body may be farther from the processing area than the one side edge when the arm body is located at the retracted position.

In the swing member of the above-described substrate processing apparatus, the arm body is provided with at least one of a nozzle supplying a processing liquid to the processing region and a cleaning member scrubbing a substrate arranged in the processing region.

In a substrate processing apparatus according to an aspect of the present invention, the substrate processing apparatus includes the swing member described above.

According to the above aspects of the present invention, it is possible to prevent the processing liquid attached to the upper surface of the swing member of the substrate processing apparatus from spilling on a processing target such as a substrate.

DETAILED DESCRIPTION OF THE PREFERRED EMBODIMENTS

Hereinafter, preferred embodiments will be described with reference to the drawings.

Figure 1:
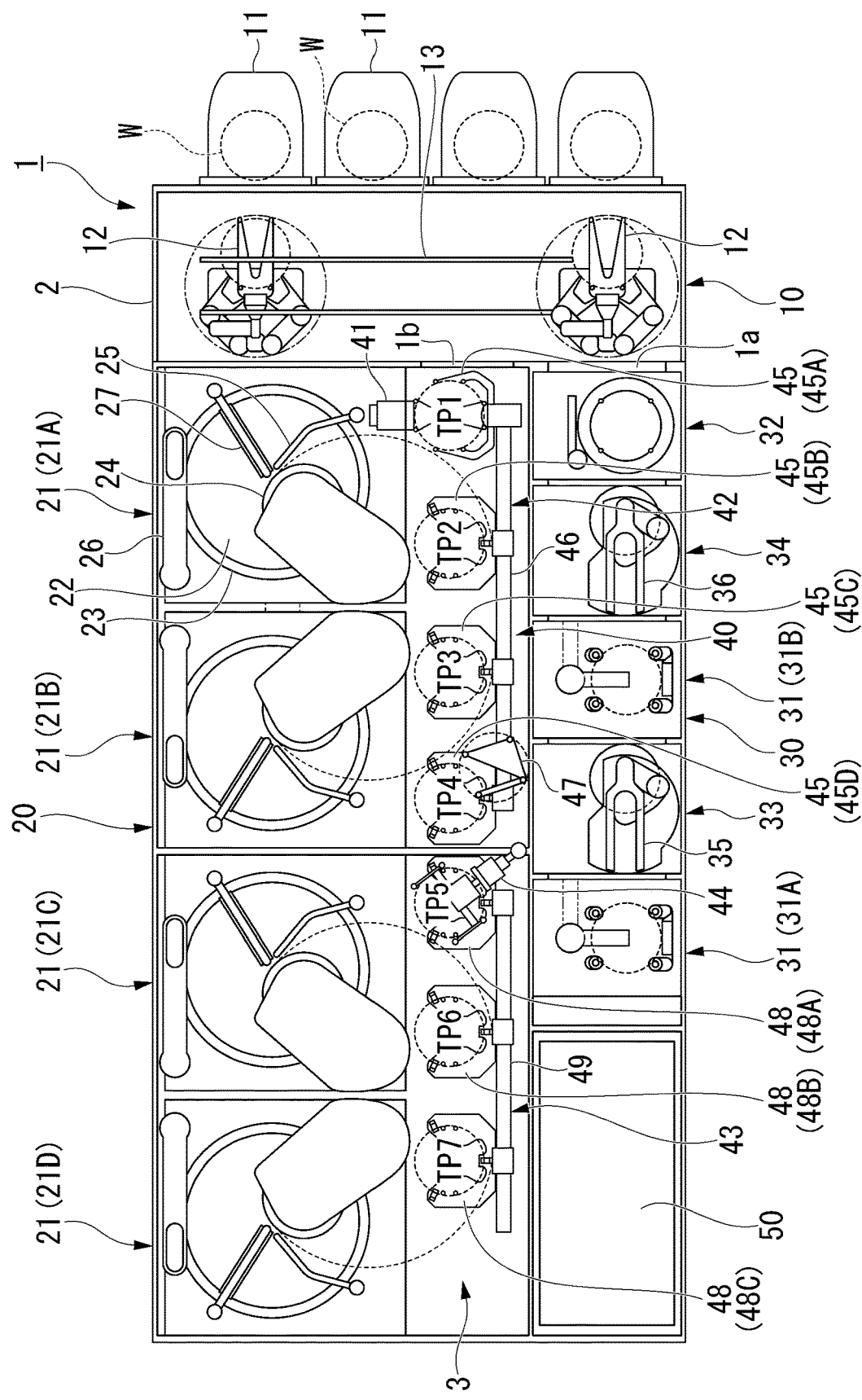
FIG. 1 is a plan view showing an entire structure of a substrate processing apparatus according to an embodiment.

FIG. 1 is a plan view showing an entire configuration of a substrate processing apparatus 1 according to an embodiment.

The substrate processing apparatus 1 shown in FIG. 1 is a chemical mechanical polishing (CMP) apparatus flatly polishing a surface of a substrate W such as a silicon wafer. The substrate processing apparatus 1 includes a rectangular box-shaped housing 2. The housing 2 is formed in a substantially rectangular shape in a plan view.

The housing 2 includes a substrate transport path 3 extending in the longitudinal direction at the center thereof. A load/unload portion 10 is arranged at one end portion of the substrate transport path 3 in the longitudinal direction. The polishing portion 20 is disposed on one side of the substrate transport path 3 in the width direction (direction orthogonal to the longitudinal direction in a plan view), and the cleaning portion 30 is disposed on the other side. The substrate transport path 3 is provided with a substrate transport portion 40 that transports the substrate W. Further, the substrate processing apparatus 1 includes a control portion (control device) 50 that comprehensively controls the operations of the load/unload portion 10, the polishing portion 20, the cleaning portion 30, and the substrate transport portion 40.

The load/unload portion 10 includes a front load portion 11 that accommodates the substrate W. A plurality of front load portions 11 are provided on one side surface of the housing 2 in the longitudinal direction. The plurality of front load portions 11 are arranged in the width direction of the housing 2. The front load portion 11 mounts, for example, an open cassette, a Standard Manufacturing Interface (SMIF) pod, or a Front Opening Unified Pod (FOUP). The SMIF and FOUP are hermetically sealed containers in which a cassette of the substrate W is accommodated and covered with a partition wall, and can maintain an environment independent of the external space.

The load/unload portion 10 also includes two transport robots 12 loading or unloading the substrate W into or from the front load portion 11, and a traveling mechanism 13 causing each of the transport robots 12 to travel along the front load portion 11. Each of the transport robots 12 is provided with two hands at an upper portion and a lower portion respectively and is used properly before and after processing the substrate W. For example, the upper hand is used when returning the substrate W to the front load portion 11, and the lower hand is used when taking out the unprocessed substrate W from the front load portion 11.

The polishing portion 20 includes a plurality of substrate polishing devices 21 (21A, 21B, 21C, and 21D) that polish (planarize) the substrate W. The plurality of substrate polishing devices 21 are arranged in the longitudinal direction of the substrate transport path 3. The substrate polishing apparatus 21 includes a polishing table 23 that rotates a polishing pad 22 having a polishing surface, a top ring 24 that holds the substrate W and polishes the substrate W while pressing the substrate W against the polishing pad 22 on the polishing table 23, a polishing liquid supply nozzle 25 that supplies a polishing liquid or a dressing liquid (for example, pure water) to the polishing pad 22, a dresser 26 that dresses the polishing surface of the polishing pad 22, and an atomizer 27 that atomizes mixed fluid of gas (for example, nitrogen gas) and liquid (for example, pure water) or liquid (for example, pure water) to spray the mixed fluid or the liquid onto the polishing surface.

The substrate polishing apparatus 21 presses the substrate W against the polishing pad 22 by the top ring 24 while supplying the polishing liquid onto the polishing pad 22 from the polishing liquid supply nozzle 25, and further moves the top ring 24 and the polishing table 23 relatively. As a result, the substrate W is polished to make its surface flat. In the dresser 26, hard particles such as diamond particles and ceramic particles are fixed to a rotating portion at the tip which contacts the polishing pad 22, and the rotating portion is swung while rotating, whereby the entire polishing surface of the polishing pad 22 is dressed uniformly and a flat polished surface is formed. In the atomizer 27, by washing away polishing debris and abrasive grains remaining on the polishing surface of the polishing pad 22 with a high-pressure fluid, cleaning of the polishing surface and dressing of the polishing surface by the dresser 26 by mechanical contact, that is, regeneration of the polishing surface is obtained.

The cleaning portion 30 includes a plurality of substrate cleaning devices 31 (31A and 31B) cleaning the substrate W, and a substrate drying device 32 drying the cleaned substrate W. The plurality of substrate cleaning devices 31 and substrate drying devices 32 are arranged in the longitudinal direction of the substrate transport path 3. A first transport chamber 33 is provided between the substrate cleaning device 31A and the substrate cleaning device 31B. The first transport chamber 33 is provided with a transport robot 35 that transports the substrate W among the substrate transport portion 40, the substrate cleaning apparatus 31A, and the substrate cleaning apparatus 31B. In addition, a second transport chamber 34 is provided between the substrate cleaning device 31B and the substrate drying device 32. The second transport chamber 34 is provided with a transport robot 36 that transports the substrate W between the substrate cleaning device 31B and the substrate drying device 32.

The substrate cleaning apparatus 31 includes, for example, a cleaning module of a two-fluid jet type described later, and cleans the substrate W with a mixed fluid of liquid and gas (two fluids). The substrate cleaning device 31A and the substrate cleaning device 31B may be of the same type or the different type of devices, for example, a cleaning module of a roll sponge type or a pencil sponge type. The substrate drying device 32 includes a drying module that performs, for example, Rotagoni drying (Iso-Propyl Alcohol (WA) drying). After the drying, a shutter 1a provided on the partition wall between the substrate drying device 32 and the load/unload portion 10 is opened, and the substrate W is taken out from the substrate drying device 32 by the transport robot 12.

The substrate transport portion 40 includes a lifter 41, a first linear transporter 42, a second linear transporter 43, and a swing transporter 44. In the substrate transport path 3, the first transport position TP1, the second transport position TP2, the third transport position TP3, the fourth transport position TP4, the fifth transport position TP5, the sixth transport position TP6, and the seventh transport position TP7 are sequentially set from a side of the load/unload portion 10.

The lifter 41 is a mechanism that vertically transports the substrate W at the first transport position TP1. The lifter 41 receives the substrate W from the transport robot 12 of the load/unload portion 10 at the first transport position TP1. In addition, the lifter 41 transports the substrate W received from the transport robot 12 to the first linear transporter 42. A shutter 1b is provided on a partition wall between the first transport position TP1 and the load/unload portion 10, and when the substrate W is transported, the shutter 1b is opened so that the transport robot 12 delivers the substrate W to the lifter 41.

The first linear transporter 42 is a mechanism that transports the substrate W among the first transport position TP1, the second transport position TP2, the third transport position TP3, and the fourth transport position TP4. The first linear transporter 42 includes a plurality of transport hands 45 (45A, 45B, 45C, and 45D), and a linear guide mechanism 46 that horizontally moves each transport hand 45 at a plurality of heights. The transport hand 45A is moved from the first transport position TP1 to the fourth transport position TP4 by the linear guide mechanism 46. The transport hand 45A is a pass hand receiving the substrate W from the lifter 41 and delivering the substrate W to the second linear transporter 43.

The transport hand 45B is moved between the first transport position TP1 and the second transport position TP2 by the linear guide mechanism 46. The transport hand 45B receives the substrate W from the lifter 41 at the first transport position TP1 and transports the substrate W to the substrate polishing apparatus 21A at the second transport position TP2. The transport hand 45B is provided with an elevating and lowering driver, and elevates when the substrate W is delivered to the top ring 24 of the substrate polishing apparatus 21A and lowers after delivering the substrate W to the top ring 24. It should be noted that the transport hand 45C and the transport hand 45D are also provided with similar elevating and lowering drivers.

The transport hand 45C is moved by the linear guide mechanism 46 between the first transport position TP1 and the third transport position TP3. The transport hand 45C receives the substrate W from the lifter 41 at the first transport position TP1 and delivers the substrate W to the substrate polishing apparatus 21B at the third transport position TP3. The transport hand 45C also functions as an access hand that receives the substrate W from the top ring 24 of the substrate polishing apparatus 21A at the second transport position TP2 and delivers the substrate W to the substrate polishing apparatus 21B at the third transport position TP3.

The transport hand 45D is moved between the second transport position TP2 and the fourth transport position TP4 by the linear guide mechanism 46. The transport hand 45D functions as an access hand that receives the substrate W from the top ring 24 of the substrate polishing apparatus 21A or the substrate polishing apparatus 21B at the second transport position TP2 or the third transport position TP3, and delivers the substrate W to the swing transporter 44 at the fourth transport position TP4.

The swing transporter 44 includes a hand that can move between the fourth transport position TP4 and the fifth transport position TP5 and transports the substrate W from the first linear transporter 42 to the second linear transporter 43. The swing transporter 44 also delivers the substrate W polished by the polishing portion 20 to the cleaning portion 30. On the side of the swing transporter 44, a temporary placing table 47 for the substrate W is provided. The swing transporter 44 vertically inverts the substrate W received at the fourth transport position TP4 or the fifth transport position TP5 and places the substrate W on the temporary placing table 47. The substrate W placed on the temporary placing table 47 is transported to the first transport chamber 33 by the transport robot 35 of the cleaning portion 30.

The second linear transporter 43 is a mechanism that transports the substrate W among the fifth transport position TP5, the sixth transport position TP6, and the seventh transport position TP7. The second linear transporter 43 includes a plurality of transport hands 48 (48A, 48B, and 48C), and a linear guide mechanism 49 that horizontally moves each of the transport hands 45 at a plurality of heights. The transport hand 48A is moved between the fifth transport position TP5 and the sixth transport position TP6 by the linear guide mechanism 49. The transport hand 45A functions as an access hand that receives the substrate W from the swing transporter 44 and delivers it to the substrate polishing apparatus 21C.

The transport hand 48B moves between the sixth transport position TP6 and the seventh transport position TP7. The transport hand 48B functions as an access hand that receives the substrate W from the substrate polishing apparatus 21C and delivers the substrate W to the substrate polishing apparatus 21D. The transport hand 48C moves between the seventh transport position TP7 and the fifth transport position TP5. The transport hand 48C functions as an access hand that receives the substrate W from the top ring 24 of the substrate polishing apparatus 21C or the substrate polishing apparatus 21D at the sixth transport position TP6 or the seventh transport position TP7 and delivers the substrate W to the swing transporter 44 at the fifth transport position TP5. Although not described, the operation of the transport hand 48 when the substrate W is delivered is the same as the operation of the first linear transporter 42 described above.

Figure 2:
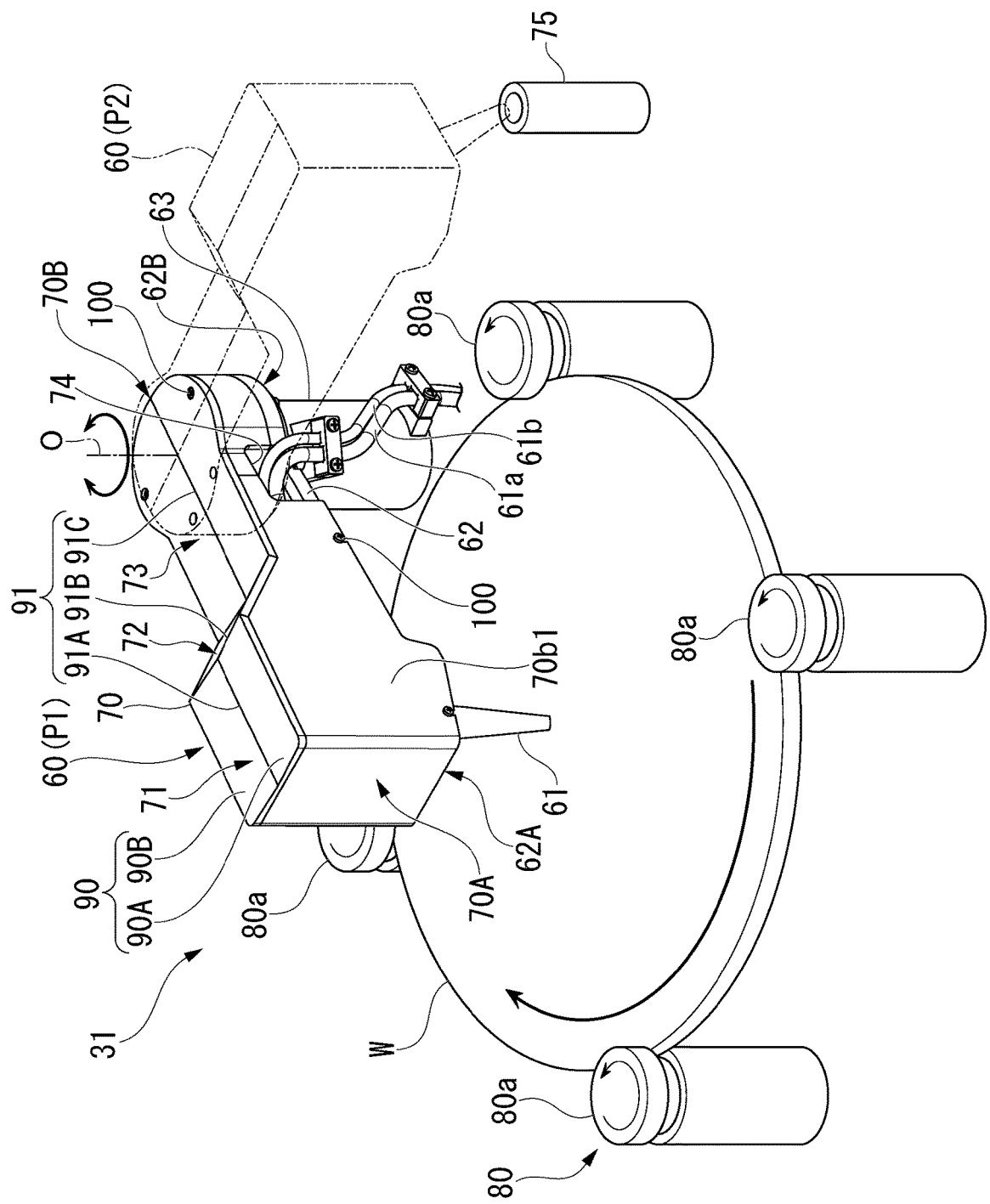
FIG. 2 is a perspective view showing a structure of a substrate cleaning apparatus according to an embodiment.

FIG. 2 is a perspective view showing the structure of the substrate cleaning apparatus 31 according to an embodiment.

The substrate cleaning device 31 includes a rotation mechanism 80 that horizontally rotates the substrate W. The rotation mechanism 80 includes a plurality of holding rollers 80a that hold the outer periphery of the substrate W and rotate around an axis extending in the vertical direction. The plurality of holding rollers 80a are connected to an electric driver such as a motor and are horizontally rotated.

The substrate cleaning apparatus 31 includes a cleaning module 60 of a two-fluid jet type that sprays two fluids (mixed fluid) onto the upper surface of the substrate W held by the rotating mechanism 80. The cleaning module 60 includes a nozzle 61, an arm body 62, and a swing shaft 63.

The nozzle 61 is connected to the gas supply tube 61a and the processing liquid supply tube 61b. The gas supply tube 61a supplies, for example, an inert gas such as nitrogen gas to the nozzle 61. The processing liquid supply tube 61b supplies, for example, pure water or a chemical liquid having a predetermined pH (for example, a neutral or alkaline chemical liquid) to the nozzle 61. The gas and the processing liquid are mixed inside the nozzle 61 and discharged from the tip of the nozzle 61.

The arm body 62 has a long shape in a plan view and extends substantially horizontally from the swing shaft 63 in the radial direction of the central axis O of the swing shaft 63. The nozzle 61 is supported by the tip portion 62A of the arm body 62. On the other hand, the base end portion 62B of the arm body 62 is connected to the upper end portion of the swing shaft 63.

The swing shaft 63 is formed in a cylindrical shape, is connected to an electric drive portion such as a motor, and rotates around a central axis O extending in the vertical direction. As a result, the arm body 62 swings (horizontal rotation) around the central axis O.

The arm body 62 (cleaning module 60) is movable between a processing position P1 located above the substrate W (processing area) and a retracted position (P2) retracted from above the substrate W by swinging around the central axis O. A processing liquid reception portion 75 is provided at the retracted position P2. The processing liquid reception portion 75 is arranged below the tip of the nozzle 61 when being located at the retracted position P2. In the processing liquid reception portion 75, an upper end is opened and can receive the processing liquid falling from the tip of the nozzle 61.

A cover 70 is attached to the arm body 62. The cover 70 has an elongated shape similar to the arm body 62 in a plan view, and surrounds the upper side of the arm body 62 from the tip end portion 62A to the proximal end portion 62B and surrounds the side surface of the arm body 62 from almost all directions. The cover 70 of the present embodiment is fixed to both side surfaces of the arm body 62 in the short-length direction by a plurality of screws 100, and is also fixed at the base end portion 62B of the arm body 62 from the vertical direction by a plurality of screws 100.

Inside the cover 70, a gas supply tube 61a and a processing liquid supply tube 61b are arranged, and a base end portion of a nozzle 61 connected to the gas supply tube 61a and the processing liquid supply tube 61b is arranged. An opening portion 74 for introducing the gas supply tube 61a and the processing liquid supply tube 61b into the cover 70 is formed on one side surface 70b1 of the cover 70 in the short-length direction.

Subsequently, the configuration of the cover 70 will be described in detail with reference to FIGS. 3 to 8. In the following description, an XYZ orthogonal coordinate system may be set, and the positional relationship of each member may be described with reference to the XYZ orthogonal coordinate system. The X-axis direction is the longitudinal direction of the cover 70, the Y-axis direction is the short-length direction (also referred to as a width direction) of the cover 70, and the Z-axis direction is the height direction (also referred to as the vertical direction) of the cover 70. The XY plane forms a horizontal plane.

Figure 3:
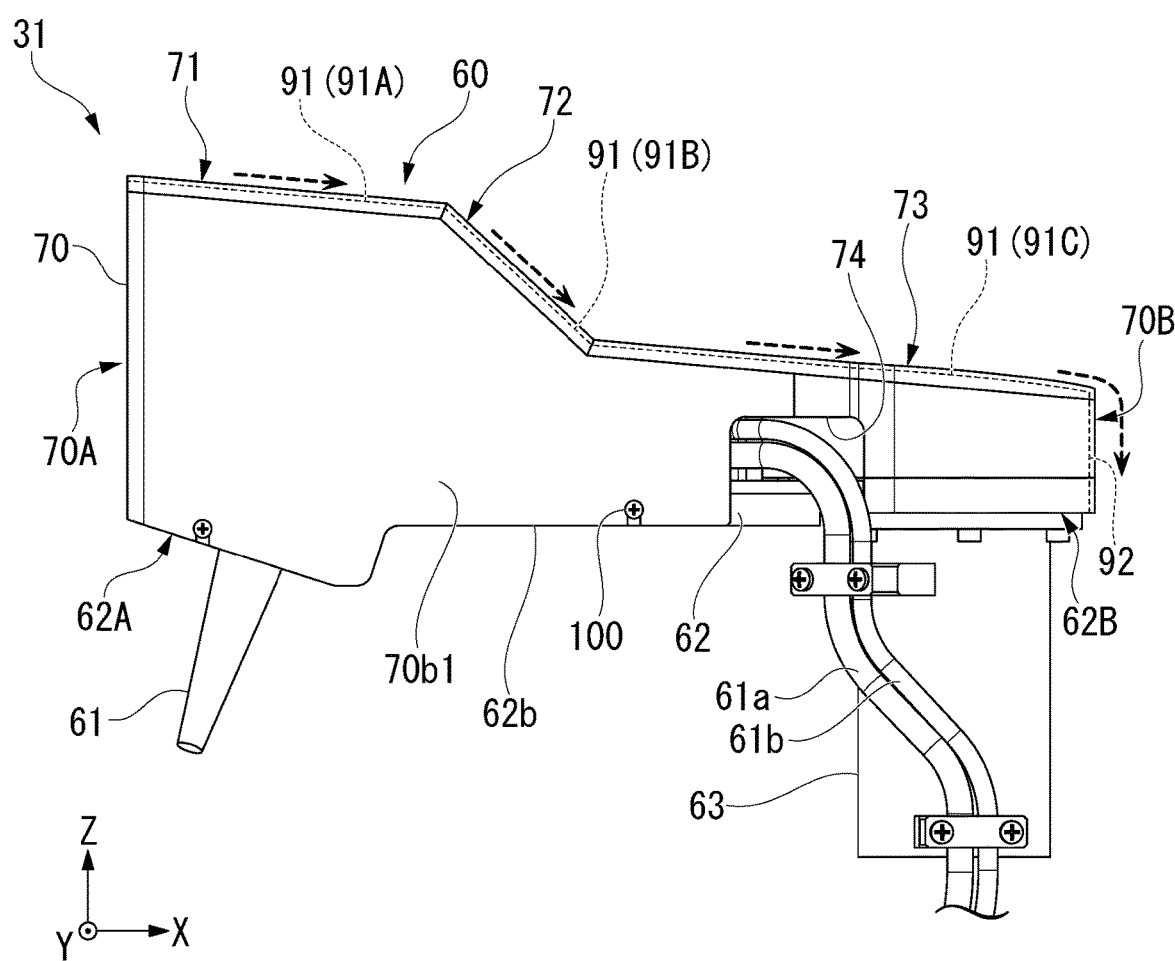
FIG. 3 is a right side view of a cover according to an embodiment as viewed from one side surface.
Figure 4:
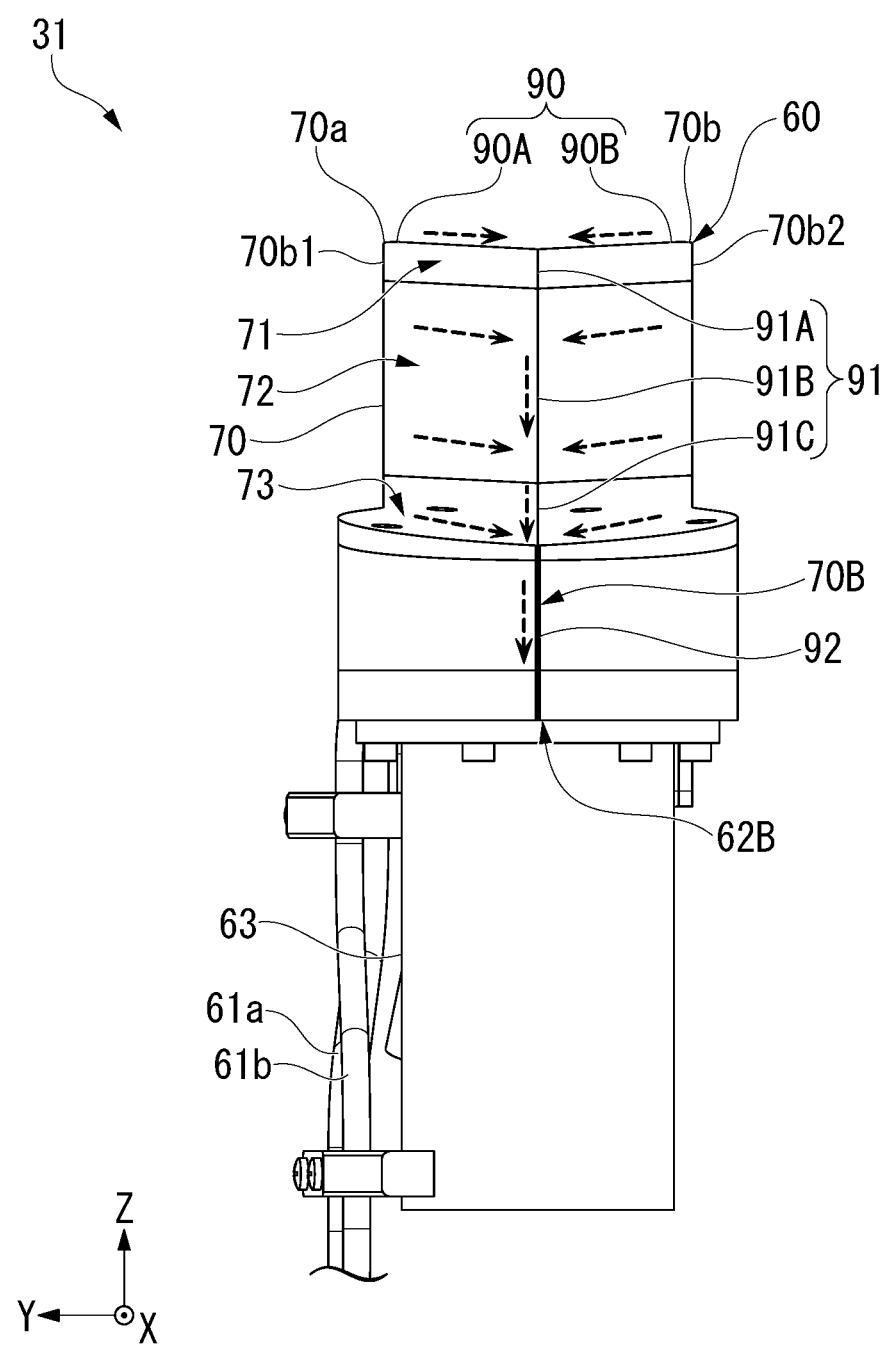
FIG. 4 is a rear view of a cover according to an embodiment as viewed from a base end portion.
Figure 5:
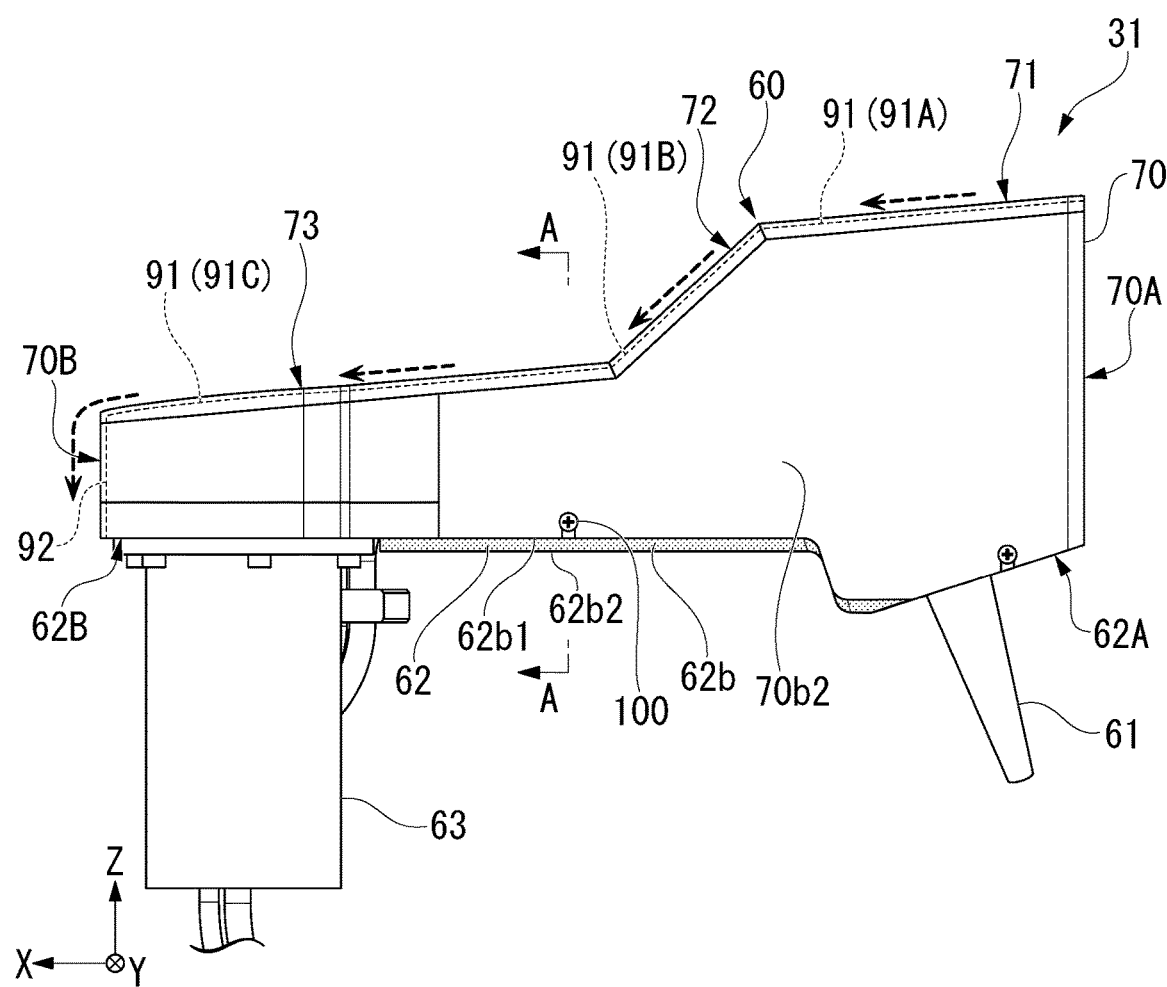
FIG. 5 is a left side view of a cover according to an embodiment as viewed from the other side surface.
Figure 6:
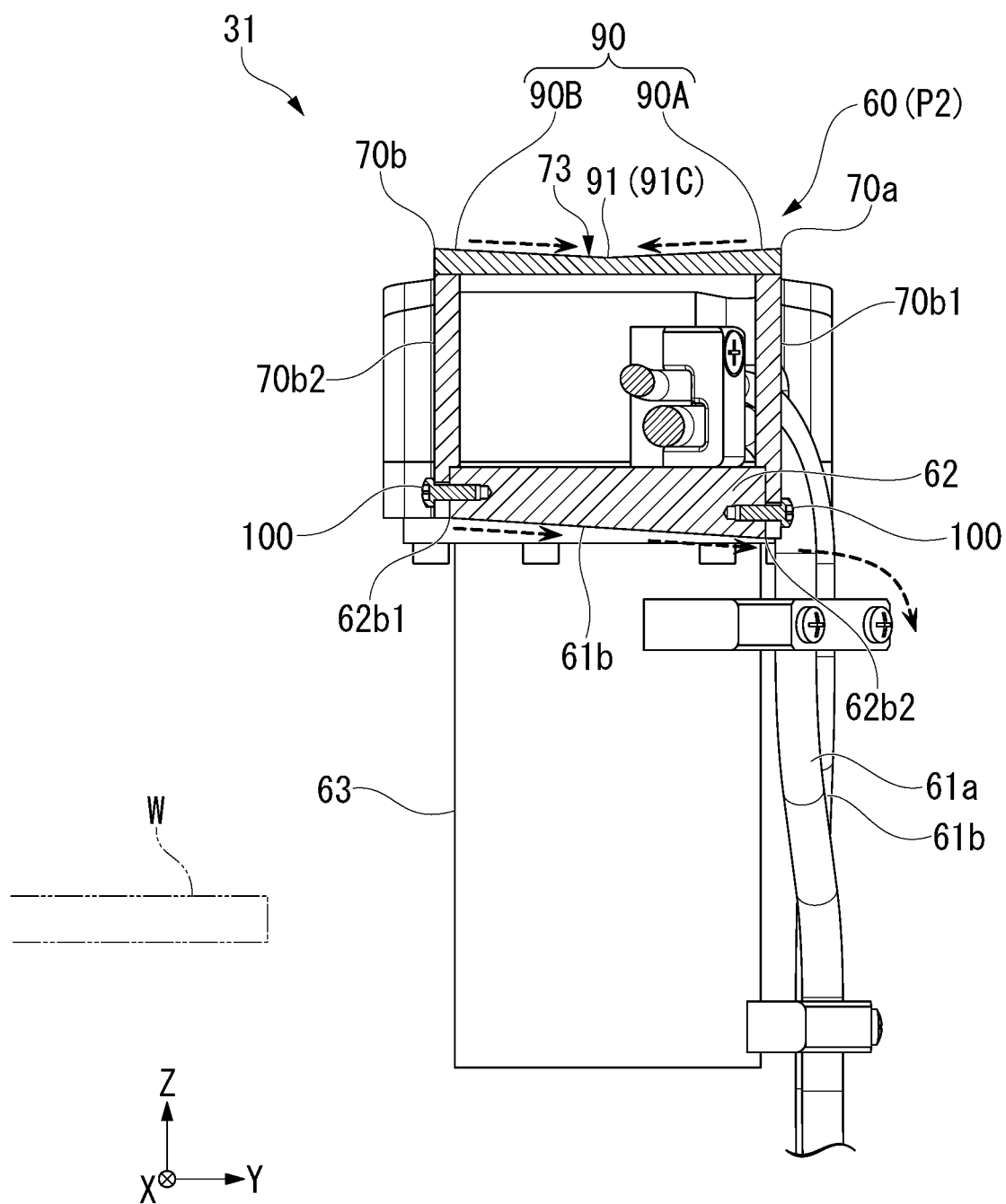
FIG. 6 is a sectional view taken along the line A-A shown in FIG. 5.
Figure 7:
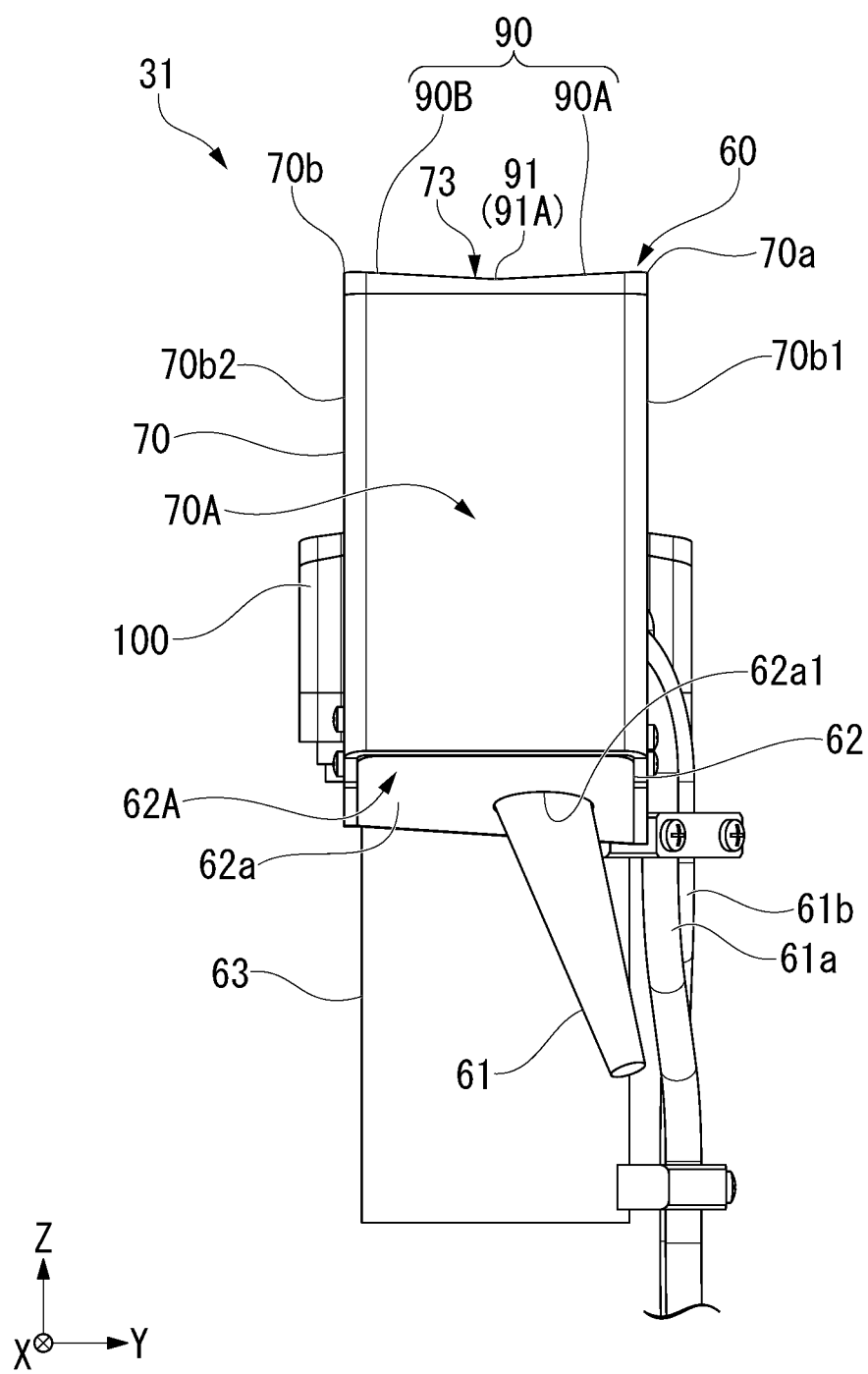
FIG. 7 is a front view of a cover according to an embodiment as viewed from a side of a tip portion.
Figure 8:
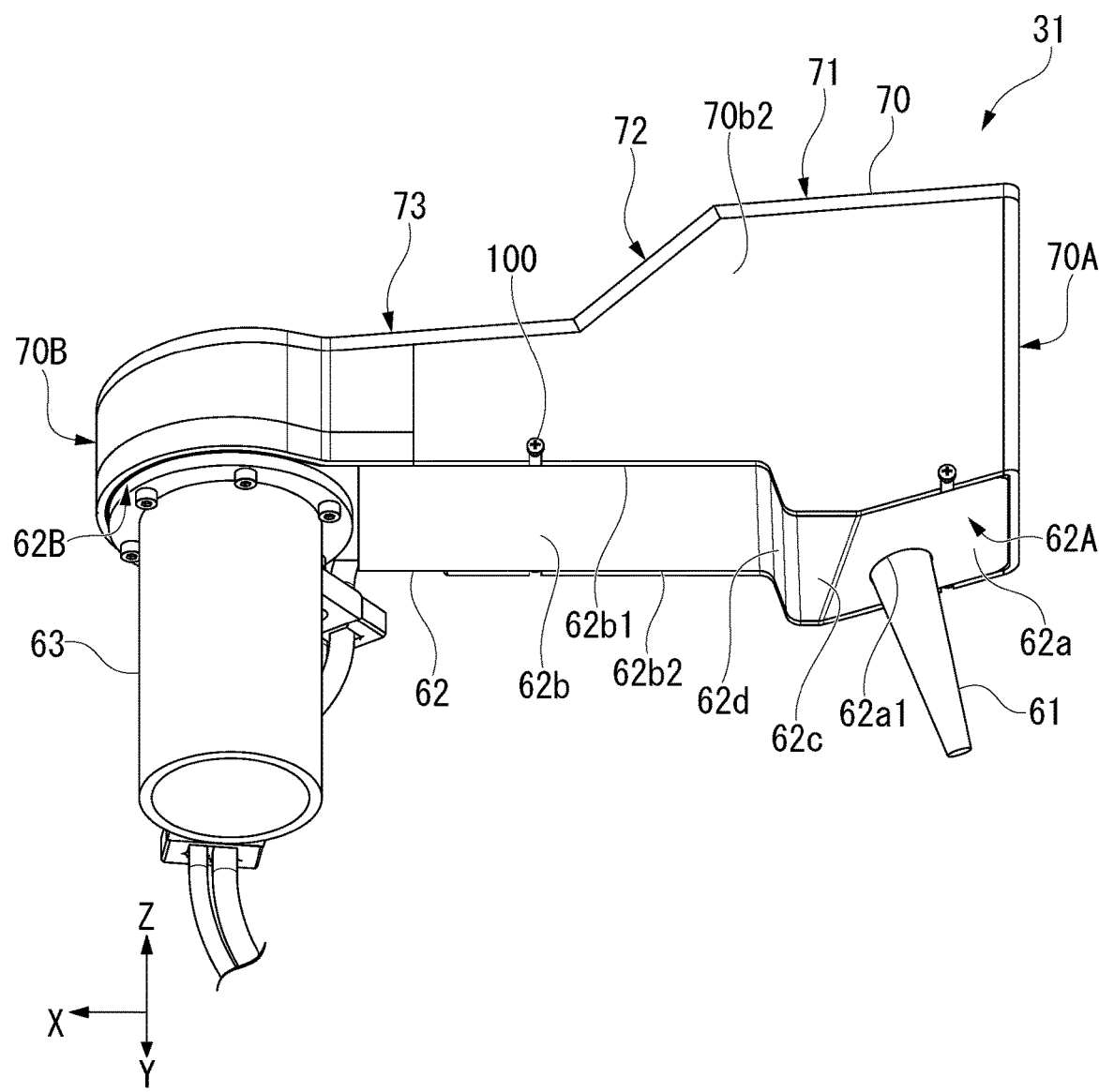
FIG. 8 is a perspective view of the lower surface of the arm main body exposed from the cover according to the embodiment, as viewed from the bottom surface side.

FIG. 3 is a right side view of the cover 70 according to one embodiment as viewed from one side surface 70b1. FIG. 4 is a rear view of the cover 70 according to one embodiment as viewed from the base end portion 70B. FIG. 5 is a left side view of the cover 70 according to one embodiment as viewed from the other side surface 70b2. FIG. 6 is a sectional view taken along the line AA of FIG. 5. FIG. 7 is a front view of the cover 70 according to one embodiment as viewed from the tip portion 70A. FIG. 8 is a perspective view of the lower surface 62b of the arm body 62 exposed from the cover 70 according to one embodiment, as viewed from the bottom surface. The broken lines in FIGS. 3 to 6 and in FIG. 9 described later indicate the flow of the processing liquid attached to the cover 70 and the arm body 62.

As shown in FIG. 3, the upper surface of the cover 70 inclines downward entirely over the cover 70 from the front end portion 70A in the longitudinal direction of the cover 70 toward the base end portion 70B. The outer surface including the upper surface of the cover 70 may be subjected to a hydrophilic surface treatment or a hydrophobic surface treatment. The upper surface of the cover 70 of the present embodiment is composed of a plurality of inclined surfaces 71, 72, and 73 that are continuous in the longitudinal direction. Each of the plurality of inclined surfaces 71, 72, and 73 is inclined with respect to the horizontal plane (XY plane) so that the base end portion 70B side (+X side) of the cover 70 is lowered.

The first inclined surface 71 is arranged on the tip portion 70A side (−X side) of the cover 70 and is arranged at a position higher than the other inclined surfaces 72 and 73. The second inclined surface 72 is continuous to the lower end of the inclined surface 71, is positioned higher than the third inclined surface 73, and inclined with an angle greater than an angle of the first inclined surface 71 (angle relative to the horizontal plane, the same applies to the following). The third inclined surface 73 is connected to the lower end of the second inclined surface 72, and inclined with an angle smaller than an angle of the second inclined surface 72. The angles of the inclined surface 71 and the inclined surface 73 may be set to, for example, 1° or more and less than 20°, and may be the same angle or different angles. The angle of the inclined surface 72 may be set to, for example, 20° or more and less than 80°.

As shown in FIG. 4, at both ends of the upper surface of the cover 70 in the short-length direction (which can be paraphrased as "an orthogonal cross-section parallel to the YZ plane orthogonal to the X-axis direction (longitudinal direction). The same applies to the following)", the first side edge 70a and the second side edge 70b are located. A first groove 91 is formed on the upper surface of the cover 70. The bottom portion of the first groove 91 is located below the first side edge 70a and the second side edge 70b. The first groove 91 is formed by a pair of inclined inner surfaces 90 that are inclined so as to become lower as they approach each other in the short-length direction. That is, the first groove 91 is a V-shaped groove. The first groove 91, in a plan view, extends in the longitudinal direction (X axis direction). The upper ends of the pair of inclined inner surfaces 90 are connected to the first side edge 70a and the second side edge 70b of the cover 70.

The pair of inclined inner surface 90 includes the first inclined inner surface 90A which is continuous to the first side edge 70a of the cover 70 and the second inclined inner surface 90B which is continuous to the second side edge 70b of the cover 70. The first inclined inner surface 90A and the second inclined inner surface 90B are connected to each other at the center portion of the cover 70 in the short-length direction. The angles of the first inclined inner surface 90A and the second inclined inner surface 90B may be, for example, 1° or more and less than 10°. The angles (absolute value) of the first inclined inner surface 90A and the second inclined inner surface 90B may be the same or different.

The first groove 91 is formed not only on the first inclined surface 71 but also on the first and second inclined surfaces 72 and 73 as shown in FIGS. 3 and 4. The first groove 91A formed in the inclined surface 71 is formed lower than the first side edge 70a and the second side edge 70b in the short-length direction of the inclined surface 71. Further, the first groove 91B formed in the inclined surface 72 is formed lower than the first side edge 70a and the second side edge 70b in the short-length direction of the inclined surface 72. Further, the first groove 91C formed in the inclined surface 73 is formed lower than the first side edge 70a and the second side edge 70b in the short-length direction of the inclined surface 73.

The first groove 91A formed in the inclined surface 71, the first groove 91B formed in the inclined surface 72, and the first groove 91C formed in the inclined surface 73 are linearly continuous in a plan view.

As shown in FIG. 4, a second groove 92 extending vertically downward is formed in the base end portion 70B of the cover 70. The second groove 92 is continuous to the lower end of the first groove 91 (first groove 91C).

As shown in FIG. 5, the arm body 62 has a lower surface 62b exposed from the cover 70. As shown in the cross-sectional view of FIG. 6, the lower surface 62b of the arm body 62 is inclined so as to get lower from one side edge 62b1 in the short-length direction of the arm body 62 toward the other side edge 62b2. The other side edge 62b2 of the arm body 62 is farther away from the substrate W than the one side edge 62b1 when the arm body 62 is located at the retracted position P2 (see FIGS. 2 and 6). That is, the lower surface 62b is inclined so that the +Y side is lower than the horizontal plane (XY plane).

As shown in FIG. 7, an insertion hole 62a1 into which the nozzle 61 is inserted is formed in the lower surface 62a of the arm body 62 on the side of the tip end portion 62A. Unlike the lower surface 62b, the lower surface 62a is inclined with respect to the horizontal plane (XY plane) so that the +X side rises.

As shown in FIG. 8, a lower surface 62c and a step surface 62d are formed between the lower surface 62a and the lower surface 62b of the arm body 62. Similar to the lower surface 62b, the lower surface 62c is inclined with respect to the horizontal plane (XY plane) so that the +Y side is lowered, and the end side connected to the lower surface 62a is inclined with respect to the YZ plane. The step surface 62d is smoothly bent from the edge of the lower surface 62c on the lower surface 62b side (not inclined with respect to the YZ plane) and extends vertically upward, and connects the lower surface 62b and the lower surface 62c.

According to the cover 70 having the above-described configuration, as shown in FIG. 4, on the upper surface of the cover 70, a first groove 91 that is lower than both side edges (first side edge 70a and second side edge 70b) of the cover 70 in the lateral direction is formed. As a result, even when the arm body 62 swings, it is possible to prevent the processing liquid that has attached to the upper surface of the cover 70 from passing over the first side edge 70a and the second side edge 70b of the cover 70 due to inertia to spill on an object to be treated such as the substrate W.

In addition, in the cover 70 of the present embodiment, the first groove 91 is formed by a pair of inclined inner surfaces 90 that are inclined so as to become lower as approaching each other in the lateral direction. As a result, the processing liquid that has attached to the upper surface of the cover 70 can be collected in the center portion of the cover 70 in the short-length direction. For this reason, the processing liquid attached to the upper surface of the cover 70 is less likely to spill from the upper surface of the cover 70.

In the cover 70 of the present embodiment, the pair of inclined inner surfaces 90 are continuously provided to the first side edge 70a and the second side edge 70b of the cover 70, and therefore, the processing liquid attached to the entire upper surface of the cover 70 can be collected in a center portion of the cover 70 in the short-length direction.

In the cover 70 of the present embodiment, as shown in FIG. 3, the upper surface of the cover 70 inclines downward entirely over the cover 70 from the tip end portion 70A to the base end portion 70B in the longitudinal direction of the cover 70. As a result, the processing liquid attached to the upper surface of the cover 70 can be poured down to the base end portion 70B of the cover 70, be separated from the substrate W and be discharged at a position where the adhesion of the processing liquid does not pose an issue.

In the cover 70 of the present embodiment, the upper surface of the cover 70 is composed of a plurality of inclined surfaces 71, 72, and 73 that are continuous in the longitudinal direction. As a result, while concavities and convexities can be formed according to the arrangement of structures inside the cover 70 (base end of the nozzle 61, gas supply tube 61a, and processing liquid supply tube 61b), the processing liquid attached to the upper surface of the cover 70 can be poured down to the base end portion 70B of the cover 70.

In addition, in the cover 70 of the present embodiment, the base end portion 70B of the cover 70 is formed with the second groove 92 extending vertically downward. As a result, the treatment liquid guided to the base end portion 70B of the cover 70 can be poured down straight from the base end portion 70B, so that the treatment liquid is not scattered around. By disposing a reception container which is not shown below the second groove 92, it becomes easy to collect and drain the processing liquid.

Further, the cleaning module 60 of the present embodiment includes an arm body 62 and a cover 70 attached to the arm body 62. As shown in FIG. 6, the arm body 62 includes a lower surface 62b exposed from the cover 70, and at least a portion of the lower surface 62b of the arm body 62 is lowered from one side edge 62b1 in the short-length direction of the arm body 62 toward the other side edge 62b2. With such configuration, it is possible to improve the drainage of the processing liquid attached to the lower surface 62b of the arm body 62.

In the cleaning module 60 of the present embodiment, as shown in FIG. 2, the arm main body 62 is movable between a processing position P1 located above the substrate W where the processing liquid (two fluids) is used and a retracted position P2 retracted from above the substrate W, and as shown in FIG. 6, the other side edge 62b2 of the lower surface 62b of the arm body 62 is farther from the processing area than the one side edge 62b1 when the arm body 62 is located at the retracted position P2. As a result, the processing liquid that has propagated on the lower surface 62b of the arm body 62 can be separated from the substrate W and poured down to a position where the adhesion of the processing liquid does not pose an issue.

As described above, according to the present embodiment, it is possible to prevent the processing liquid attached to the upper surface of the cover 70 in the cleaning module 60 of the substrate processing apparatus 1 from spilling on the processing target such as the substrate W.

Figure 9:
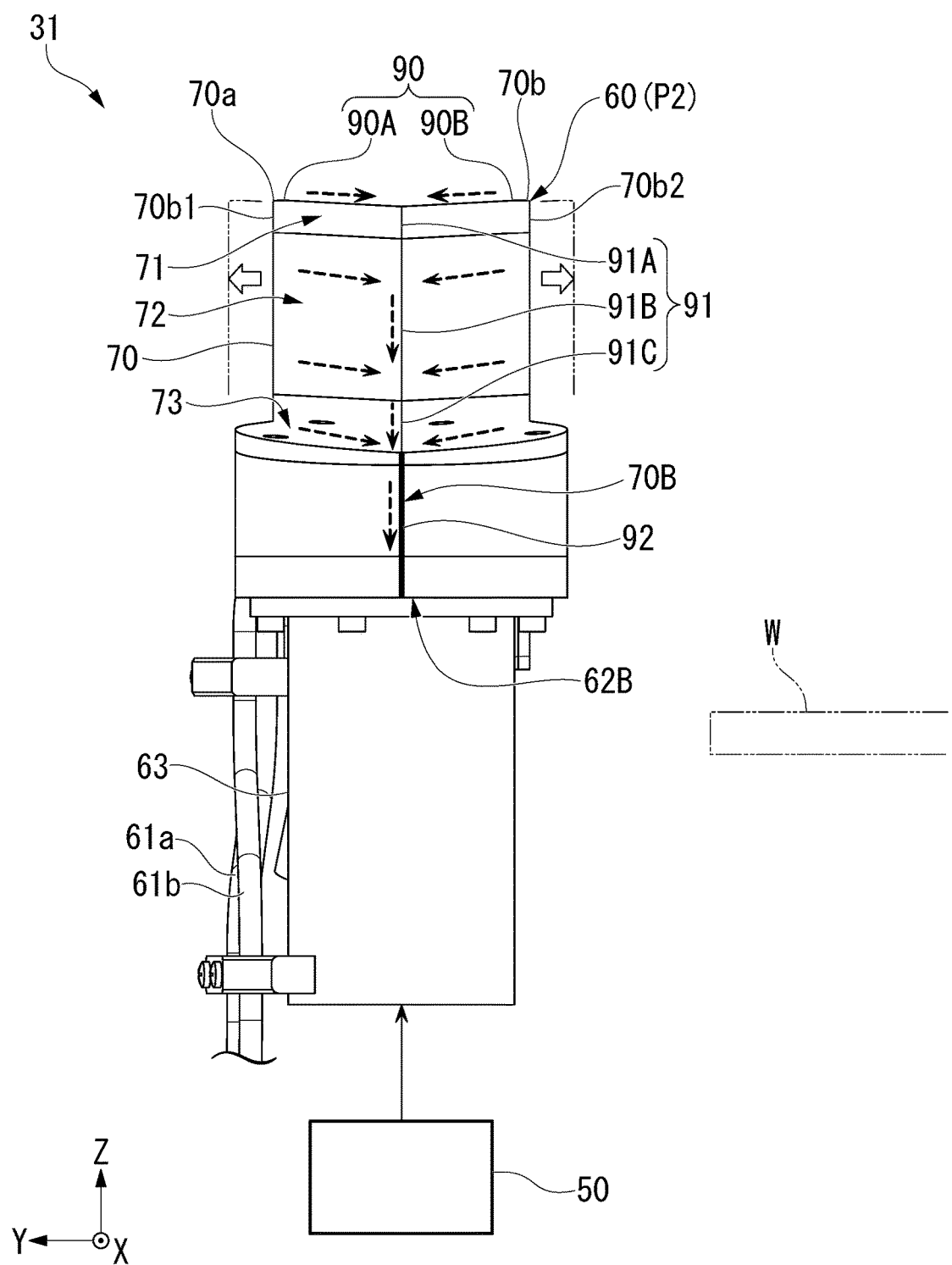
FIG. 9 is a rear view of a modification of a substrate cleaning apparatus according to one embodiment, in which a cover is viewed from a base end portion.

Note that, as in the modified example shown in FIG. 9, the cover 70 may be vibrated before the arm body 62 swings, and the processing liquid attached to the upper surface of the cover 70 may be positively poured down. In the example shown in FIG. 9, the control portion 50 (see FIG. 1) causes the swing shaft 63 to rotate in a clockwise and a counter-clockwise direction at a small angle so that the cover 70 slightly vibrates before the arm body 62 swings. Alternatively, a vibrator (vibration motor, ultrasonic vibrator, and the like) may be attached to the cover 70, and the cover 70 may be slightly vibrated before the arm body 62 swings. Alternatively, when cleaning the cleaning module 60 or the surroundings thereof (for example, when performing a dummy dispense process for cleaning the inside of the nozzle 61, or when cleaning the cleaning chamber in which the cleaning module 60 is arranged), after the cleaning is completed, the cover 70 may be slightly vibrated.

While the preferred embodiments of the invention have been described and explained, it is to be understood that these are illustrative of the invention and are not to be considered limitations. Additions, omissions, substitutions, and other changes can be made without departing from the scope of the invention. Therefore, the present invention should not be considered limited by the foregoing descriptions, but rather by the claims.

For example, in the above-described embodiment, it is described that the first groove 91 is formed in the upper surface of the cover 70 (provisionally referred to as configuration A), and the upper surface of the cover 70 inclines downward (provisionally referred to as configuration B) entirely over the cover 70 from the front end portion 70A to the base end portion 70B in the longitudinal direction of the cover 70. However, even in the case of one of the configuration A and the configuration B alone, the effect of preventing the processing liquid adhered to the upper surface of the cover 70 from spilling onto the object to be treated can be obtained. Note that in the configuration B, the upper surface of the cover 70 may be formed by a single inclined plane over the entire longitudinal direction of the cover 70.

Furthermore, for example, in the above-described embodiment, the configuration is described that a pair of inclined inner surface 90 forming the first groove 91 is continuous to the first side edge 70a and the second side edge 70b of the cover 70. However, for example, the pair of inclined inner surfaces 90 may be formed so as to be separated inward from the first side edge 70a and the second side edge 70b of the cover 70 in the short-length direction. That is, a flat surface portion having the same height as the first side edge 70a and the second side edge 70b in the short-length direction may be formed on a portion of the upper surface of the cover 70.

In addition, for example, a shape of the first groove 91 may not be limited to a V-shape in a sectional view and may be a concave shape or a U shape in a sectional view. In the upper surface of the cover 70, a plurality of first grooves 91 may be formed at intervals or be adjacent to each other in the short-length direction.

For example, in the above-described embodiment, the configuration in which the cover 70 is attached to the arm body 62 of the cleaning module 60 of a two-fluid jet type has been described; however, the configuration is not limited to this. The cover is applicable to all swing portions of the substrate processing apparatus 1.

For example, in the substrate cleaning apparatus 31, in a cleaning module of a pencil sponge type of another cleaning aspect, the cover may be attached to the arm body (for example, an arm 115 provided with a cleaning tool of a pen type 108 at a tip end portion thereof as shown in FIGS. 9 and 10 of Japanese Unexamined Patent Application, First Publication No. 2017-147334) where a cleaning member for scrubbing the substrate W is provided at a tip portion.

In addition, for example, in the substrate polishing apparatus 21 shown in FIG. 1, the cover may be attached to the swing members such as the top ring 24, the polishing liquid supply nozzle 25, the dresser 26, and the atomizer 27, In the substrate cleaning apparatus 31, the "processing area where the processing liquid is used" is the upper surface of the substrate W (see FIG. 2); however, in the substrate polishing apparatus 21, the "processing area where the processing liquid is used" is the upper surface of the polishing pad 22 (see FIG. 1).

For example, in the above-described embodiment, the CMP apparatus is exemplified as the substrate cleaning apparatus of the present invention; however, the apparatus other than the CMP apparatus (for example, a back surface polishing apparatus, a bevel polishing apparatus, an etching apparatus, or a plating apparatus) may be used.

Moreover, the embodiments and the modified examples described above may be combined appropriately.

What is claimed is:

1. A cover for a swing member of a substrate processing apparatus,
   the cover comprising:
   an upper surface comprising a first groove;
   a first side edge and a second side edge located respectively at both ends of the upper surface in a short-length direction of the cover;
   wherein a bottom portion of the first groove is located lower than the first side edge and the second side edge,
   wherein at least part of the first groove is located between the first side edge and the second side edge, and
   wherein the upper surface of the cover inclines downward entirely over the cover from a tip end portion to a base end portion in a longitudinal direction of the cover, the tip end portion of the cover is movable to a position above a processing region of the substrate processing apparatus, and the base end portion of the cover is at a position other than a position above the processing region.

2. The cover for a swing member of a substrate processing apparatus according to claim 1, wherein the first groove is formed by a pair of inclined inner surfaces that are inclined so as to become lower as approaching each other in the short-length direction.

3. The cover for a swing member of a substrate processing apparatus according to claim 2, wherein the pair of inclined inner surfaces are connected to the first side edge and the second side edge respectively.

4. The cover for a swing member of a substrate processing apparatus according to claim 1, wherein the cover is formed by a plurality of inclined surfaces that are continuous in the longitudinal direction.

5. The cover for a swing member of a substrate processing apparatus according to claim 1, wherein a second groove extending vertically downward is formed in the base end portion of the cover.

6. A swing member of a substrate processing apparatus, the swing member comprising:
   an arm body; and
   the cover according to claim 1 attached to the arm body.

7. The swing member of a substrate processing apparatus according to claim 6, wherein:
   the arm body comprises a lower surface exposed from the cover; and
   at least a portion of the lower surface of the arm body is lowered from one side edge toward the other side edge of the arm body in the short-length direction.

8. The swing member of a substrate processing apparatus according to claim 7, wherein:
   the arm body is movable between a processing position located above the processing region where the processing liquid is used and a retracted position retracted from above the processing region; and
   the other side edge of the lower surface of the arm body is farther from the processing region than the one side edge when the arm body is located at the retracted position.

9. The swing member of a substrate processing apparatus according to claim 8, wherein the arm body is provided with at least one of a nozzle supplying a processing liquid to the processing region and a cleaning member scrubbing a substrate arranged in the processing region.

10. A substrate processing apparatus comprising the swing member according to claim 6.

11. The substrate processing apparatus according to claim 10, wherein the substrate processing apparatus further comprises:

a swing shaft that is connected to the arm body, and
a control portion that causes the swing shaft to rotate in a clockwise and a counter-clockwise direction so that the cover vibrates.

12. The cover for a swing member of a substrate processing apparatus according to claim 1, wherein a shape of the first groove in a sectional view is V-shape or concave shape or U-shape.

13. The cover for a swing member of a substrate processing apparatus according to claim 2, wherein the pair of inclined inner surfaces are connected to each other at a center portion of the cover in the short-length direction.

\* \* \* \* \*